(12) United States Patent
Nishikawa et al.

(10) Patent No.: US 8,599,571 B2
(45) Date of Patent: Dec. 3, 2013

(54) MEMORY CARD

(75) Inventors: Hidenobu Nishikawa, Nara (JP); Daido Komyoji, Nara (JP); Atsunobu Iwamoto, Yamagata (JP); Hiroyuki Yamada, Osaka (JP); Shuichi Takeda, Yamagata (JP); Shigeru Kondou, Osaka (JP)

(73) Assignee: Panasonic Corporation, Osaka (JP)

( * ) Notice: Subject to any disclaimer, the term of this patent is extended or adjusted under 35 U.S.C. 154(b) by 73 days.

(21) Appl. No.: 12/279,915

(22) PCT Filed: Apr. 18, 2007

(86) PCT No.: PCT/JP2007/058398
§ 371 (c)(1),
(2), (4) Date: Aug. 19, 2008

(87) PCT Pub. No.: WO2007/123143
PCT Pub. Date: Nov. 1, 2007

(65) Prior Publication Data
US 2010/0084762 A1    Apr. 8, 2010

(30) Foreign Application Priority Data
Apr. 21, 2006    (JP) .................. 2006-117587

(51) Int. Cl.
H01L 23/12    (2006.01)
H01L 23/02    (2006.01)
H01L 23/34    (2006.01)
H05K 7/00    (2006.01)
H05K 7/20    (2006.01)
H05K 1/11    (2006.01)

(52) U.S. Cl.
USPC ........... 361/760; 361/803; 361/720; 257/704; 257/723; 257/679

(58) Field of Classification Search
USPC .......................................... 361/803, 720, 760
See application file for complete search history.

(56) References Cited

U.S. PATENT DOCUMENTS

| | | | |
|---|---|---|---|
| 6,431,456 B2 * | 8/2002 | Nishizawa et al. | 235/492 |
| 6,713,849 B2 * | 3/2004 | Hasebe et al. | 257/667 |
| 7,429,790 B2 * | 9/2008 | Condie et al. | 257/709 |
| 2003/0166313 A1 * | 9/2003 | Nishikawa et al. | 438/118 |
| 2003/0227075 A1 * | 12/2003 | Kanemoto et al. | 257/666 |
| 2004/0066693 A1 * | 4/2004 | Osako et al. | 365/222 |
| 2006/0151614 A1 | 7/2006 | Nishizawa et al. | |
| 2006/0220204 A1 * | 10/2006 | Wada et al. | 257/679 |

FOREIGN PATENT DOCUMENTS

| | | |
|---|---|---|
| JP | 01-289186 | 11/1989 |
| JP | 4-28598 | 1/1992 |
| JP | 05-335715 | 12/1993 |

(Continued)

Primary Examiner — Chuong A Luu
Assistant Examiner — Cory Eskridge
(74) Attorney, Agent, or Firm — McDermott Will & Emery LLP

(57) ABSTRACT

Memory card (1) includes at least semiconductor chip (3), circuit board (2) with semiconductor chip (3) mounted on main surface (21), having at least rigidity reducing portion (23) formed in main surface (21) or in a linear region of surface (22) opposite to the main surface, and cover portion (71) for covering semiconductor chip (3) on main surface (21) of circuit board (2), wherein circuit board (2) has a plurality of convex regions (201) which flex in a convex shape toward main surface (21) due to rigidity reducing portion (23).

8 Claims, 6 Drawing Sheets

(56) References Cited

FOREIGN PATENT DOCUMENTS

| | | |
|---|---|---|
| JP | 6-13177 | 2/1994 |
| JP | 08-197878 | 8/1996 |
| JP | 09-121081 | 5/1997 |
| JP | 10-233463 | 9/1998 |
| JP | 2000-151060 | 5/2000 |
| JP | 2001-257464 | 9/2001 |
| JP | 2002-198631 | 7/2002 |
| JP | 2002-279386 | 9/2002 |
| JP | 2002-289979 | 10/2002 |
| JP | 2002289979 A * | 10/2002 |
| JP | 2004-13738 | 1/2004 |
| JP | 2004-133516 | 4/2004 |
| JP | 2004-259746 | 9/2004 |
| JP | 2005-11212 | 1/2005 |
| JP | 2005-057090 | 3/2005 |
| WO | WO 2005/004047 A1 | 1/2005 |

* cited by examiner

MEMORY CARD

RELATED APPLICATIONS

This application is the U.S. National Phase under 35 U.S.C. §371 of International Application No. PCT/JP2007/058398, filed on Apr. 18, 2007, which in turn claims the benefit of Japanese Application No. 2006-117587, filed on Apr. 21, 2006, the disclosures of which Applications are incorporated by reference herein.

TECHNICAL FIELD

The present invention relates to a memory card.

BACKGROUND ART

Recently, a memory card having a memory chip as a recording medium for recording information is used. Such a memory card is excellent in portability, and widely used as a recording medium for portable electronic equipment such as a portable information terminal and a portable telephone. And, portable electronic equipment is increasingly reduced in size and thickness in recent years from the viewpoint of improved portability, and in this respect, it is required to reduce the size and thickness of the memory card.

In order to meet the requirement, in the manufacture of a memory card, a gold wire or the like is used for wire bonding of an electrode on a memory chip and an electrode on a circuit board for the purpose of connection and mounting thereof. Specifically, for example, another memory chip is first laminated in a position a little shifted on a memory chip bonded to a lead frame by using an adhesive agent or double-side adhesive tape. Subsequently, the electrode of a control chip bonded on the lead-frame and the electrode of two memory chips is connected to the lead frame via a gold wire. A technology for reducing the thickness of a memory card in this way is disclosed (for example, see Patent Document 1).

Also available is a method of flip-chip mounting a memory chip or control chip on a circuit board via a resin material.

However, as shown in the memory card of Patent Document 1, a memory chip and control chip are generally formed from a silicon material, and a circuit board is formed from glass epoxy resin in many cases. And, since glass epoxy resin is greater in thermal expansion coefficient than silicon, when the temperature on a bonding process decreases to the normal temperature, the circuit board shrinks more than the memory chip. However, such shrinking is suppressed on the mounting surface because a memory chip is bonded to the mounting surface of the circuit board. As a result, the circuit board flexes in a convex shape toward the mounting surface side of the memory chip, equivalently increasing in thickness of the circuit board, causing a problem to arise against the reduction in thickness of the memory card. Such flexing of the circuit board is more remarkable when the bonding temperature is higher because the temperatures of the circuit board and the memory chip are lowered to the normal temperature after the memory chip is bonded to a flat circuit board in a state of being heated, for example, by using a thermal press-fitting method. That is, when the difference between the temperature in bonding the circuit board and memory chip and the normal temperature is greater, the flexing amount of the circuit board becomes larger.

Further, a memory chip is bonded to a circuit board via adhesive agent, the circuit board sometimes flexes in a convex shape toward the mounting surface side due to shrinking of the adhesive agent coagulated. The cause of this is the difference in rigidity between memory chip and circuit board, and there arises greater influence in a circuit board being less in rigidity.

Also, since shrinking at the mounting surface side of the circuit board is suppressed by the memory chip, there exist a great stress in the electrode that is a bonding portion. As a result, there is a problem of reliability because the lowering of bonding strength or peeling is liable to take place depending upon the heat history or external load under the using environment.

As described above, there are important problems such as the generation of flexure of a memory card and lowering of the connection reliability due to the difference in thermal expansion coefficient and shrinkage between memory chip, circuit board and adhesive agent.

Patent Document 1 Unexamined Japanese Patent Publication 2004-13738

SUMMARY OF THE INVENTION

The memory card of the present invention includes at least a semiconductor chip, which is mounted on main surface side, a circuit board having a rigidity reducing portion formed at least in a linear region of main surface or on the opposite side of main surface, and a cover portion for covering the semiconductor chip on main surface side of the circuit board, wherein the circuit board includes a plurality of convex regions flexing in a convex shape toward the main surface side due to the rigidity reducing portion.

In this configuration, it is possible to realize a thin memory card reduced in flexure of the circuit board. Also, a memory card having excellent connection reliability can be obtained, decreasing stresses between the semiconductor chip and the circuit board (between the bump connected and the electrode in particular).

Figure 1:
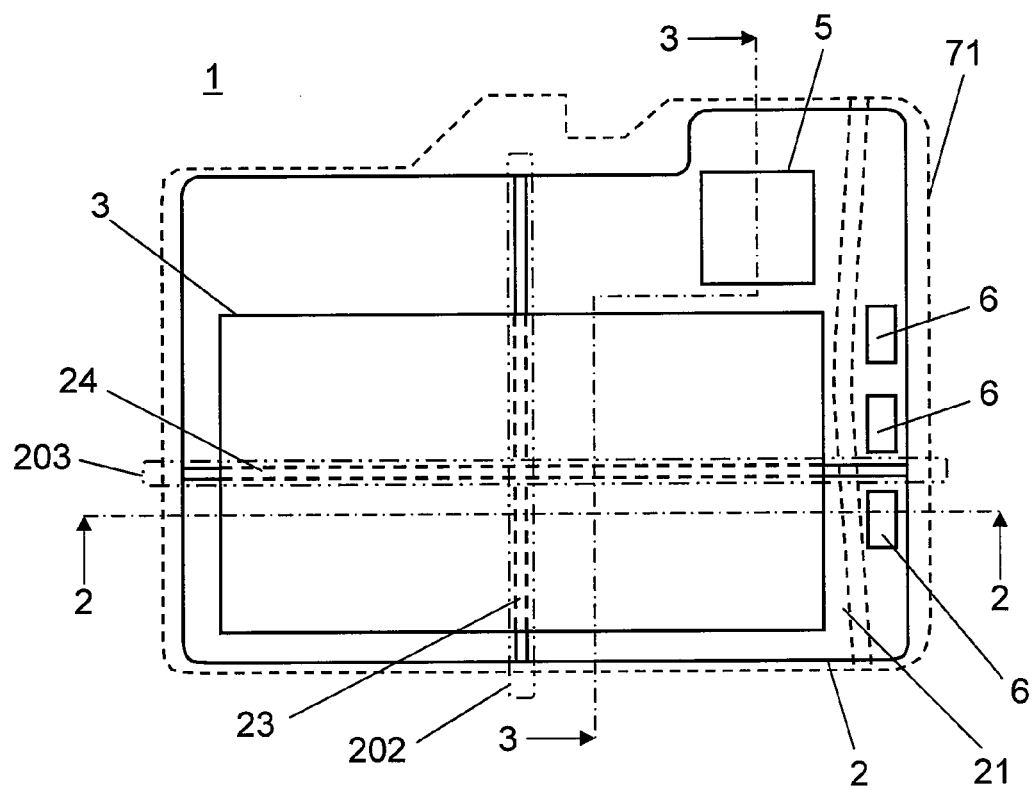
FIG. 1 is a plan view showing the configuration of a memory card in a first preferred embodiment of the present invention.

DESCRIPTION OF THE REFERENCE NUMERALS AND SIGNS 1, 1a, 1b, 1c, 1d, 1e, 1f, 1g Memory card
2 Circuit board
3 Semiconductor chip (first semiconductor chip)
5 Semiconductor chip (second semiconductor chip)
6 Chip component
21, 31 Upper surface
22 Lower surface
23, 23a, 23b First groove
24 Second groove
25, 26 Penetrating-hole
27 Notch
33, 53 Bump
41, 42 Sealing resin layer
71, 72 Cover portion
201 Convex region
202 First linear region (linear region)
203 Second linear region
211, 212, 213 Electrode
221 External electrode
711 Concave portion

DETAILED DESCRIPTION OF THE PREFERRED EMBODIMENTS

The memory card in the preferred embodiment of the present invention will be described in the following with reference to the drawings.

First Preferred Embodiment

Figure 2:
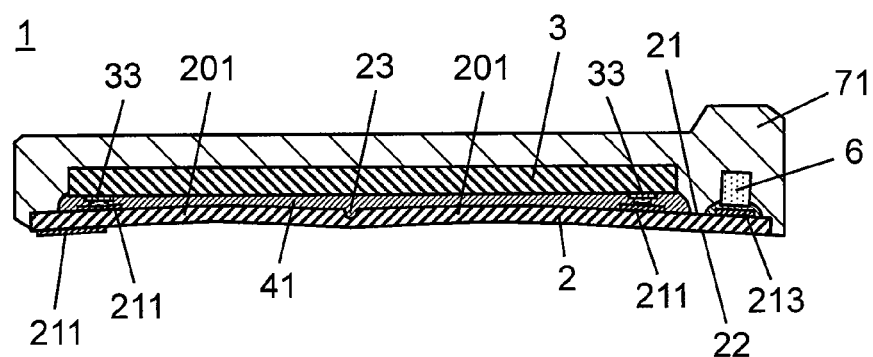
FIG. 2 is a sectional view along the 2-2 line of the memory card shown in FIG. 1.
Figure 3:
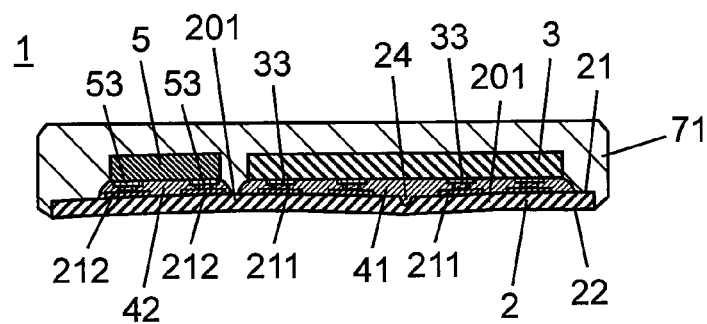
FIG. 3 is a sectional view along the 3-3 line of the memory card shown in FIG. 1.

FIG. 1 is a plan view showing the configuration of memory card 1 in the first preferred embodiment of the present invention. FIG. 2 is a sectional view along the 2-2 line of memory card 1 in FIG. 1. FIG. 3 is a sectional view along the 3-3 line of a memory card 1 in FIG. 1. In FIG. 1, in order to facilitate the understanding of the internal structure of memory card 1, only the contour of cover portion 71 is shown by broken line, and the sealing resin layer used for mounting the semiconductor chip is not shown (same in FIG. 4 to FIG. 8). Also, in FIG. 2 and FIG. 3, the flexure of circuit board 2 is exaggerated in the illustration (same in FIG. 9 and FIG. 10).

In the present preferred embodiment, micro-SD memory card (micro secure digital memory card) will be described as an example of memory card 1. Generally, the length and width (horizontal and vertical sizes in FIG. 1) and thickness (vertical size in FIG. 2 and FIG. 3) of memory card 1 are respectively 15 mm, 11 mm and 1 mm. Also, the upper side and the lower side in FIG. 2 and FIG. 3 respectively correspond to the upper side and lower side of memory card 1 for the convenience of description. It is the same in each of the following preferred embodiments. Also described in the following is a memory card having a configuration that includes a first linear region and second linear region as linear regions, a first rigidity reducing portion and second rigidity reducing portion as rigidity reducing portions, and a first semiconductor chip and second semiconductor chip as semiconductor chips.

As shown in FIG. 1 to FIG. 3, memory card 1 includes circuit board 2 having a nearly rectangular shape, first semiconductor chip 3 mounted on main surface at the upper side (hereinafter called upper surface) 21 of circuit board 2 with ball bump (so-called "stud bump" and hereinafter just called "bump") 33 disposed therebetween, second semiconductor chip 5 mounted on upper surface 21 of circuit board 2 with bump 53 disposed therebetween, sealing resin layer 41, 42 located between first semiconductor chip 3, second semiconductor chip 5, and circuit board 2, fine chip components 6 such as resistors and capacitors mounted by using solder on upper surface 21 of circuit board 2, and cover portion 71 for covering first semiconductor chip 3, second semiconductor chip 5, sealing resin layers 41, 42, and chip components 6 on upper surface 21 of circuit board 2. In this case, cover portion 71 is formed so as to cover first semiconductor chip 3 or the like by insert-forming of thermoplastic resin for example on upper surface 21 of circuit board 2.

Circuit board 2 is mainly formed by using glass epoxy resin, and as shown in FIG. 2 and FIG. 3, it includes electrode 211 to which first semiconductor chip 3 is bonded, electrode 212 to which second semiconductor chip 5 is bonded, and electrode 213 to which chip component 6 is bonded on upper surface 21 thereof. Further, on main surface at the lower side (hereinafter called lower surface) 22 of circuit board 2, there are provided a plurality of external electrodes 221 for making connections with external electronic equipment. In this case, external electrode 221 is electrically connected to the wiring disposed on upper surface 21 via through-hole (not shown) communicated from lower surface 22 to upper surface 21 of circuit board 2.

Also, as shown in FIG. 1 and FIG. 2, on upper surface 21 of circuit board 2 are formed first groove 23 as the first rigidity reducing portion in first linear region 202 linearly extending along the widthwise direction (vertical direction in FIG. 1) where first semiconductor chip 3 is mounted. Similarly, as shown in FIG. 1 and FIG. 3, second groove 24 is formed as the second rigidity reducing portion in second linear region 203 linearly extending along the lengthwise direction (that is, horizontal direction in FIG. 1) vertical to first groove 23 where first semiconductor chip 3 is mounted. In FIG. 2 and FIG. 3, the width and depth of first groove 23 and second groove 24 are exaggerated in the illustration.

Here, first groove 23 and second groove 24 are desirable to be perpendicular at nearly the center (that is, center of lengthwise direction and widthwise direction) of the region where at least upper surface 21 of circuit board 2 is opposed to first semiconductor chip 3, but there is no particular limitation. In this case, first groove 23 and second groove 24 are formed, as shown in FIG. 2 and FIG. 3, so that the sectional shapes are nearly semi-elliptic shape of 50 μm for example in width and depth. The sectional shapes of first groove 23 and second groove 24 are preferable to be semi-circular, triangular, or rectangular other than the nearly semi-elliptic shape. And, first groove 23 and second groove 24 are formed for example by etching, laser beam machining, or cutting process.

Also, first semiconductor chip 3 and second semiconductor chip 5 are bare chips formed mainly from a silicon material, which are generally smaller in coefficient of thermal expansion (thermal expansion coefficient) than circuit board 2 formed from glass epoxy resin. Specifically, the thermal expansion coefficient of first semiconductor chip 3 and second semiconductor chip 5 ranges from about 2 ppm/° C. to 3 ppm/° C., and the thermal expansion coefficient of circuit board 2 is about 15 ppm/° C.

In this case, first semiconductor chip 3 is for example a memory chip for storing various information, and second semiconductor chip 5 is a control chip for controlling first semiconductor chip 3. And, first semiconductor chip 3 includes bump 33 formed on an electrode, and bump 33 is bonded (including a state of being contacted) to electrode 211 of circuit board 2 by means of sealing resin layer 41. Similarly, second semiconductor chip 5 includes bump 53 formed on an electrode, and bump 53 is bonded (including a state of being contacted) to electrode 212 of circuit board 2 by means of sealing resin layer 42. In this case, sealing resin layers 41, 42 are formed for example by adhering non-conductive resin film NCF (Non-Conductive Film) that is a film-form resin material onto the upper surface of circuit board 2.

And, in the manufacture of memory card 1 of the present preferred embodiment, first semiconductor chip 3 and second semiconductor chip 5 are first heated at about 190° C. to 200° C. and thermally press-fitted onto circuit board 2 while pressing them via NCF for example. In this way, NCF is heated and hardened to form sealing resin layers 41, 42, then first semiconductor chip 3 and second semiconductor chip 5 are bonded to circuit board 2.

Subsequently, after first semiconductor chip 3 and second semiconductor chip 5 are thermally press-fitted onto circuit board 2 held in a flat status in a mounting device, the temperature of each semiconductor chip and circuit board 2 becomes lowered to normal temperatures (about 25° C.). In this case, in memory card 1, first semiconductor chip 3, second semiconductor chip 5, and circuit board 2 shrink in accordance with the respective thermal expansion coefficients due to lowering of the temperature. And, as described above, since first semiconductor chip 3 and second semiconductor chip 5 are smaller in thermal expansion coefficient than circuit board 2, the shrinkage of circuit board 2 is greater than that of first semiconductor chip 3 and second semiconductor chip 5. However, the shrinkage is suppressed because upper surface 21 of circuit board 2 is bonded to first semiconductor chip 3 and second semiconductor chip 5. On the other hand, lower surface 22 of circuit board 2 being free from restriction shrinks with the temperature lowered. As a result, circuit board 2 flexes in a convex shape toward upper surface 21.

The flexure of circuit board 2 in the vicinity of second semiconductor chip 5 is less than the flexure of circuit board 2 in the vicinity of first semiconductor chip 3 because second semiconductor chip 5 is smaller in shape than first semiconductor chip 3.

In this case, as in the conventional configuration, when a first groove that is the first rigidity reducing portion and a second groove that is the second rigidity reducing portion are not formed in the circuit board, the circuit board in the vicinity of the first semiconductor chip of the circuit board flexes in a radial (spherical) shape peaking at the position nearly opposing to the center of the first semiconductor chip. Further, other regions of the circuit board not mounted with the first semiconductor chip and second semiconductor chip also flex due to the above flexure, resulting in great flexure of the entire circuit board.

On the other hand, in the case of memory card 1 in the present preferred embodiment, since first groove 23 that is the first rigidity reducing portion disposed in upper surface 21 of circuit board 2, the rigidity of circuit board 2 is reduced at the position of first groove 23. As a result, as shown in FIG. 2, the regions on either side of first groove 23 of circuit board 2 individually flex in a convex shape toward upper surface 21.

Also, since second groove 24 that is the second rigidity reducing portion disposed in upper surface 21 of circuit board 2, the rigidity of circuit board 2 is reduced at the position of second groove 24. In this way, as shown in FIG. 3, the regions on either side of second groove 24 of circuit board 2 individually flex in a convex shape toward upper surface 21.

That is, in circuit board 2, a plurality of regions (four regions in the above case) divided by first groove 23 and second groove 24 individually flex. Accordingly, unlike a circuit board entirely flexing because of having no first groove and second groove, it is possible to suppress the entire flexure of circuit board 2 (distance in the direction of thickness from the peak of flexure to the lower end of flexure of circuit board 2).

Specifically, in memory card 1, even when first semiconductor chip 3 being different in thermal expansion coefficient from circuit board 2 is mounted, the convex flexure toward upper surface 21 of circuit board 2 generated due to mounting of first semiconductor chip 3 is formed as a plurality of convex regions 201 in a state of being divided by the first groove and the second groove. And, the flexure of entire circuit board 2 is suppressed by the plurality of convex regions 201. Here, suppose the flexure of circuit board 2 is same in curvature, then the amount of flexure can be decreased to about ½ by dividing the two convex regions for example. As a result, the thickness of circuit board 2 substantially lessens, and memory card 1 can be reduced in thickness.

Also, the flexure of circuit board 2 shrinking due to hardening of NCF or the like for example that is a sealing resin layer can be similarly suppressed because of first groove 23 and second groove 24. In this way, for example, in a case where forming a memory card by using semiconductor chip and circuit board which are nearly equal in thermal expansion coefficient and different in rigidity, even though sealing resin layers different in thermal expansion coefficient is used, the flexure of the circuit board can be reduced.

Memory card 1 of the present preferred embodiment is arranged in a position (especially, in a position near the center of first semiconductor chip 3 in the lengthwise direction) where first linear region 202 formed with first groove 23 overlaps with first semiconductor chip 3. In this way, in the vicinity of the peak of flexure generated when first groove 23 is not disposed, it is possible to lower the rigidity of circuit board 2 and to suppress the flexure caused due to mounting of first semiconductor chip 3. Similarly, it is arranged in a position (especially, in a position near the center of first semiconductor chip 3 in the widthwise direction) where second linear region 203 formed with second groove 24 is perpendicular to first linear region 202 and overlaps with first semiconductor chip 3. In this way, in the vicinity of the peak of flexure generated when second groove 24 is not disposed, it is possible to lower the rigidity of circuit board 2 and to further suppress the flexure caused due to mounting of first semiconductor chip 3.

Also, memory card 1 of the present preferred embodiment is excellent in connection reliability because stresses in the bonded portion between the bump of the semiconductor chip and the electrode of the circuit board, generated due to difference in the amount of shrinkage between the circuit board and the semiconductor chip, can be decreased and lowered by each rigidity reducing portion.

Further, memory card 1 of the present preferred embodiment is able to further suppress the flexure of circuit board 2 because cover portion 71 can be formed in a state such that circuit board 2 is being pressed against the die when cover portion 71 is insert-molded by using thermoplastic resin. Moreover, during the insert-molding of cover portion 71, first groove 23 and second groove 24 are buried in the thermoplastic resin. In this way, it makes up for lowering of rigidity due to first groove 23 and second groove 24, improving the rigidity of circuit board 2, bending rigidity in particular, and it is possible to realize a memory card that is strong against deformation.

In the present preferred embodiment, an example of disposing a first groove that is the first rigidity reducing portion and a second groove that is the second rigidity reducing portion on the circuit board has been described, but the present invention is not limited to this configuration, and it is allowable to dispose only one of the grooves. Also, the first groove is perpendicular to the second groove in the configuration described, but it is also allowable to be configured in that the grooves are crossing each other at a certain angle. Further, it is allowable to dispose a plurality of grooves in a plurality of linear regions.

Also, in the present preferred embodiment, an example of disposing a first groove that is the first rigidity reducing portion and a second groove that is the second rigidity reducing portion on the circuit board in such manner that the grooves are perpendicular (crossing) each other in a region opposing to the first semiconductor chip larger in size, but the present invention is not limited to this configuration. For example, the crossing position is optional provided that it is within the circuit board.

Also, in the present preferred embodiment, an example of disposing a first groove that is the first rigidity reducing portion and a second groove that is the second rigidity reducing portion in the upper surface of the circuit board has been described, but the present invention is not limited to this configuration. For example, it is allowable to disposed the grooves in the lower surface or both surfaces of the circuit board. In that case, it is not always required to dispose the first rigidity reducing portion and the second rigidity reducing portion in the corresponding positions of the upper surface and lower surface of the circuit board, but it is preferable to dispose the rigidity reducing portions more on the main surface than on the other surface. In this way, the circuit board becomes easier to flex in a convex shape toward the semiconductor chip.

Second Preferred Embodiment

Figure 4:
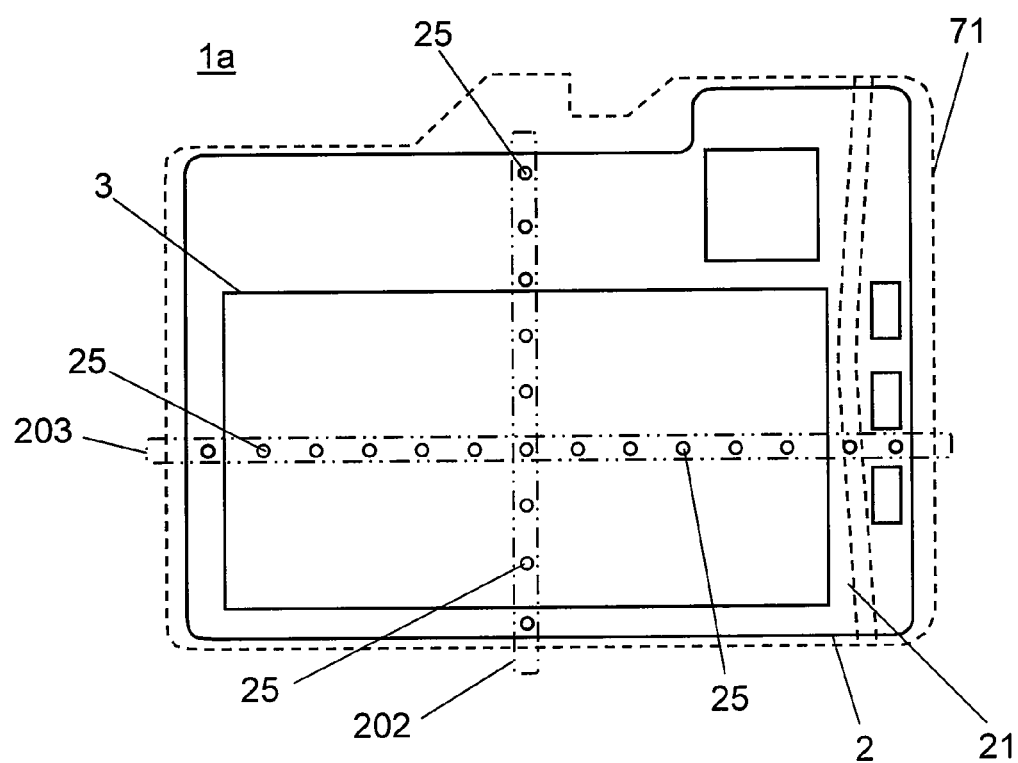
FIG. 4 is a plan view showing the configuration of a memory card in a second preferred embodiment of the present invention.

Memory card 1a in the second preferred embodiment of the present invention will be described in the following with reference to FIG. 4. FIG. 4 is a plan view showing the configuration of memory card 1a in the second preferred embodiment of the present invention.

Memory card 1a shown in FIG. 4 is different from memory card 1 shown in FIG. 1 to FIG. 3 in such point that a plurality of circular penetrating-holes 25 for example are arranged as the first rigidity reducing portion of first linear region 202 and the second rigidity reducing portion of second linear region 203 of circuit board 2 instead of the first groove and the second groove. The other components are same in configuration and given same reference numerals for the purpose of description. In this preferred embodiment, as the opening shape of penetrating-hole 25 piercing circuit board 2, a circle is described as an example, but the present invention is not limited to this. For example, as the opening shape of penetrating-hole 25, various shapes such as rectangular and elliptic shapes are allowable and will bring about similar effects.

That is, as shown in FIG. 4, a plurality of penetrating-holes 25 are formed as the first rigidity reducing portion of first linear region 202 and the second rigidity reducing portion of second linear region 203 of memory card 1a, and it is intended to reduce the rigidity of circuit board 2 at the first rigidity reducing portion and the second rigidity reducing portion. In this case, the penetrating-hole is formed for example by etching, laser beam machining, cutting, or punching.

Thus, same as in the first preferred embodiment, a plurality of regions divided by first linear region 202 and second linear region 203 on circuit board 2 individually flex in a convex shape toward upper surface 21, thereby forming convex regions. As a result, the flexure of entire circuit board 2 can be suppressed, enabling the thickness reduction, and also it is possible to lower the stress given to the connection of the electrode of the circuit board and the bump of each semiconductor chip and to realize a memory card that assures excellent reliability.

In this case, generally, when the circuit board of a memory card has a penetrating-hole, it is necessary to seal the penetrating-hole in order to prevent foreign matter or the like from intruding into the mounting side of the circuit board. However, in the case of memory card 1a in the present preferred embodiment, when cover portion 71 is insert-molded, plurality of penetrating-holes 25 can be sealed by filling them with thermoplastic resin. Consequently, no sealing process is needed for penetrating-holes 25, and it is possible to simplify the manufacture of memory card 1a.

In the present preferred embodiment, a plurality of penetrating-holes 25 are just described as holes, but the present invention is not limited to this. For example, it is allowable to use all or a part of the plurality of penetrating-holes as through-holes for electrically connecting upper surface 21 to lower surface 22 (see FIG. 2 and FIG. 3) of circuit board 2. In this way, it gives rise to the improvement of convenience with respect to the connection of upper and lower surfaces of the circuit board.

Third Preferred Embodiment

Figure 5A:
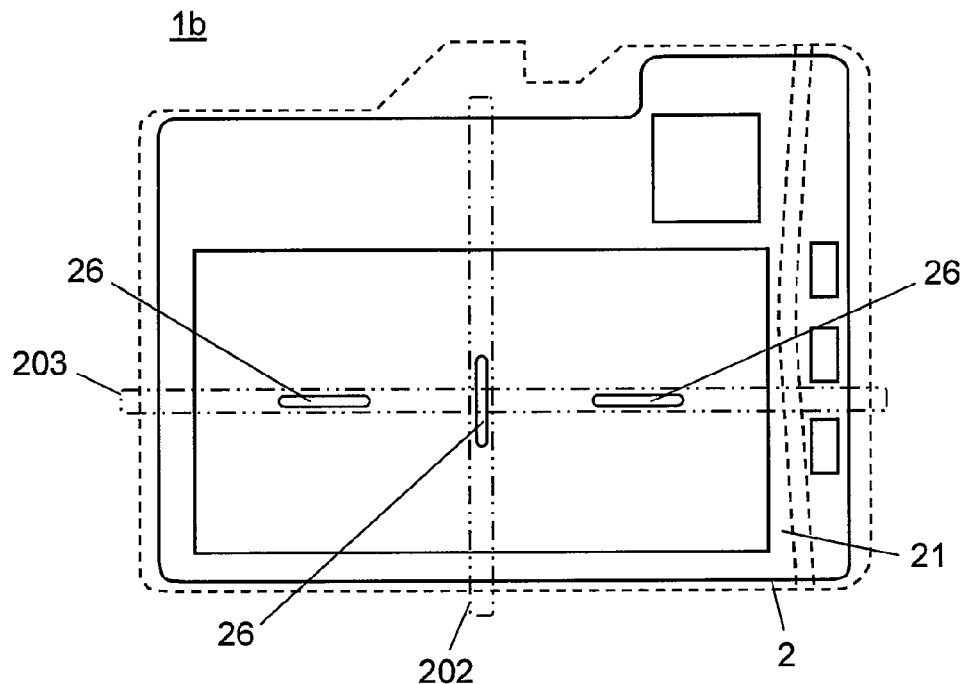
FIG. 5A is a plan view showing the configuration of a memory card in a third preferred embodiment of the present invention.

Memory card 1b in the third preferred embodiment of the present invention will be described in the following with reference to FIG. 5A. FIG. 5A is a plan view showing the configuration of memory card 1b in the third preferred embodiment of the present invention.

Memory card 1b shown in FIG. 5A is different from memory card 1 shown in FIG. 1 to FIG. 3 in such point that one oval penetrating-hole 26 as the first rigidity reducing potion and two oval penetrating-holes 26 as the second rigidity reducing portions are respectively formed in the first linear region 202 and the second linear region 203 of circuit board 2. The other components are same in configuration and given same reference numerals for the purpose of description. In this preferred embodiment, as the opening shape of penetrating-hole 26 piercing circuit board 2, an oval is described as an example, but the present invention is not limited to this. As the opening shape of penetrating-hole 26, various shapes such as rectangular and elliptic shapes are allowable and will bring about similar effects.

That is, as shown in FIG. 5A, in memory card 1b, penetrating-holes 26 are formed as the first rigidity reducing portion of first linear region 202 and the second rigidity reducing portion of second linear region 203, and it is intended to reduce the rigidity of circuit board 2 at the first rigidity reducing portion and the second rigidity reducing portion. In this case, the penetrating-hole is formed for example by etching, laser beam machining, cutting, or punching. In this way, same as in the first preferred embodiment, a plurality of regions divided by first linear region 202 and second linear region 203 on circuit board 2 individually flex in a convex shape toward upper surface 21, thereby forming convex regions. As a result, the flexure of entire circuit board 2 can be suppressed, enabling the thickness reduction. Further, it is possible to lower the stress given to the connection of the electrode of the circuit board and the bump of each semiconductor chip and to realize a memory card that assures excellent connection reliability.

Another example of a memory card in the third preferred embodiment of the present invention will be described in the following with reference to FIG. 5B.

Figure 5B:
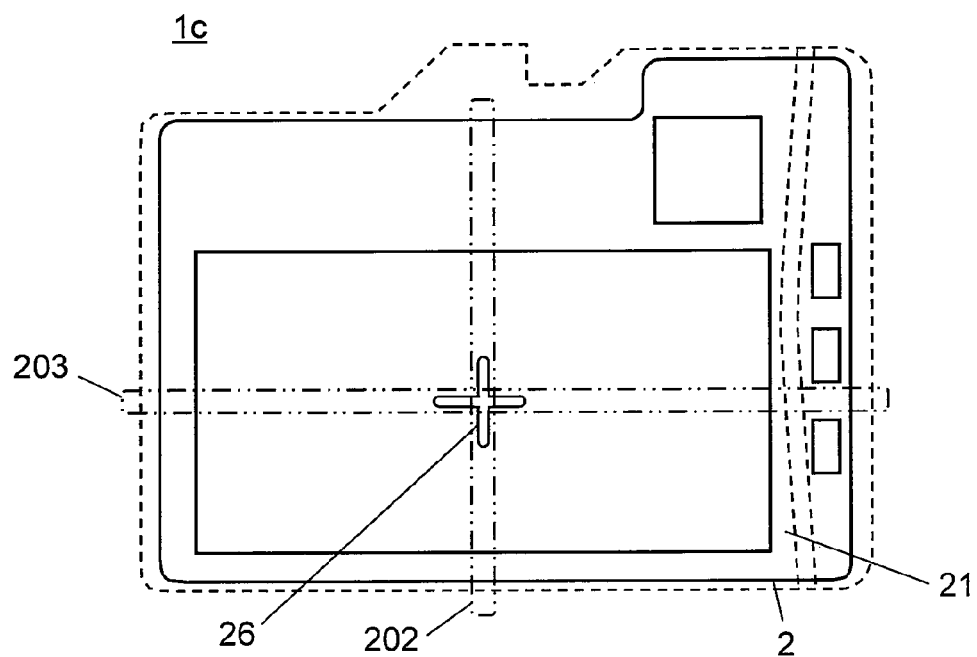
FIG. 5B is a plan view showing another example of configuration of a memory card in the third preferred embodiment of the present invention.

FIG. 5B is a plan view showing the configuration of another example of the memory card in the third preferred embodiment of the present invention.

Memory card 1c shown in FIG. 5B is provided with cross-shaped penetrating-hole 26 as the first rigidity reducing portion and the second rigidity reducing portion at the intersection of first linear region 202 and second linear region 203 of circuit board 2. In this way, it is possible to obtain same effects as in memory card 1b.

In place of cross-shaped penetrating-hole 26, it is also allowable for example to dispose a T-shaped penetrating-hole as the first rigidity reducing portion of first linear region 202 and the second rigidity reducing portion of second linear region 203 of circuit board 2.

Fourth Preferred Embodiment

Figure 6:
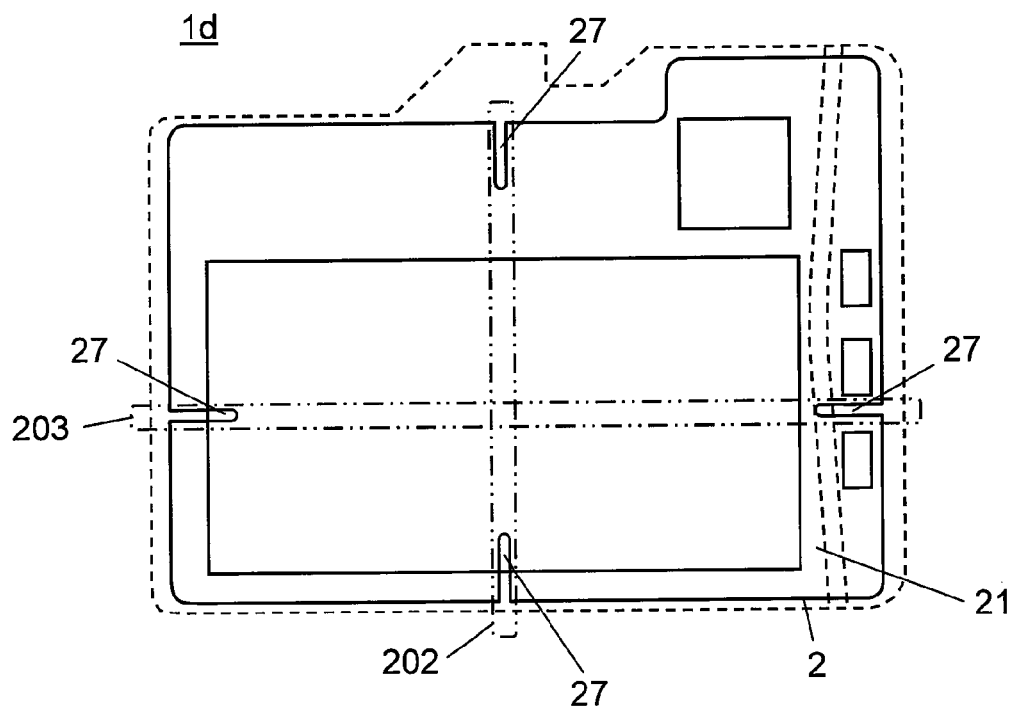
FIG. 6 is a plan view showing the configuration of a memory card in a fourth preferred embodiment of the present invention.

Memory card 1d in the fourth preferred embodiment of the present invention will be described in the following with reference to FIG. 6. FIG. 6 is a plan view showing the configuration of memory card 1d in the fourth preferred embodiment of the present invention.

Memory card 1d shown in FIG. 6 is different from memory card 1 shown in FIG. 1 to FIG. 3 in such point that as the first rigidity reducing potion of first linear region 202 and the second rigidity reducing portion of second linear region 203 of circuit board 2, in place of the first groove and second groove, there are provided a pair of notches 27 extending from the ends in the opposite directions in first linear region 202 and second linear region 203 of circuit board 2. The other components are same in configuration and given same reference numerals for the purpose of description.

That is, as shown in FIG. 6, in memory card 1d, as the first rigidity reducing portion of first linear region 202 and the second rigidity reducing portion of second linear region 203, a pair of notches 27 opposing to each other are formed in each of the regions, and it is intended to lower the rigidity of circuit board 2 at the first rigidity reducing portion and the second rigidity reducing portion. In this case, the notch is formed for example by etching, laser machining, cutting or punching. In this way, same as in the first preferred embodiment, a plurality of regions divided by first linear region 202 and second linear region 203 on circuit board 2 individually flex in a convex shape toward upper surface 21, thereby forming convex regions. As a result, the flexure of entire circuit board 2 can be suppressed, enabling the thickness reduction. Further, it is possible to decrease the stress given to the connection of the electrode of the circuit board and the bump of each semiconductor chip and to realize a memory card that assures excellent reliability.

In the present preferred embodiment, only one of the paired notches opposing to each other is formed in the region where the first semiconductor chip is mounted, but the present invention is not limited to this configuration. For example, all the notches are allowable to be formed in the region where the first semiconductor chip is mounted. Thus, it is possible to further reduce the flexure of the circuit board.

Fifth Preferred Embodiment

Figure 7:
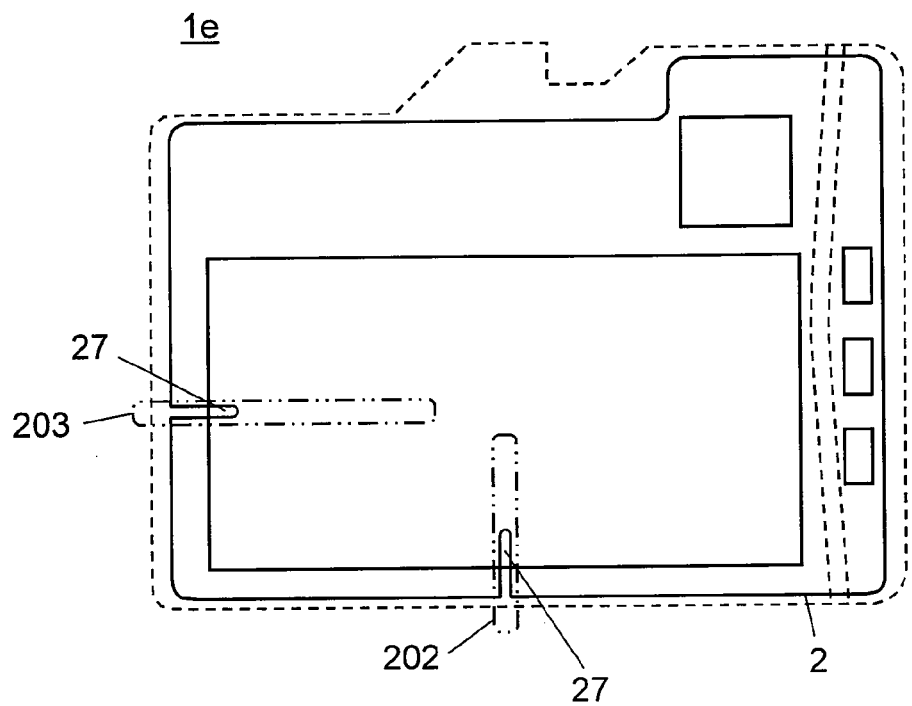
FIG. 7 is a plan view showing the configuration of a memory card in a fifth preferred embodiment of the present invention.

Memory card 1e in the fifth preferred embodiment of the present invention will be described in the following with reference to FIG. 7. FIG. 7 is a plan view showing the configuration of memory card 1e in the fifth preferred embodiment of the present invention.

Memory card 1e shown in FIG. 7 is different from memory card 1 shown in FIG. 1 to FIG. 3 in such point that as the first rigidity reducing potion of first linear region 202 and the second rigidity reducing portion of second linear region 203 of circuit board 2, in place of the first groove and second groove, there is provided one notch 27 in first linear region 202 and second linear region 203 of circuit board 2. The other components are same in configuration and given same reference numerals for the purpose of description.

That is, as shown in FIG. 7, in memory card 1e, as the first rigidity reducing portion of first linear region 202 and the second rigidity reducing portion of second linear region 203, one notch 27 is formed in order to lower the rigidity of circuit board 2 at the first rigidity reducing portion and the second rigidity reducing portion. In this way, it is possible to suppress the flexure of entire circuit board 2 the same as in the first preferred embodiment.

Also, the configuration of memory card 1e in the present preferred embodiment is especially suitable when there is no space for forming a pair of notches 27 opposing to each other as in the fourth preferred embodiment or the rigidity of circuit board 2 is excessively lowered due to the pair of notches 27.

In the present preferred embodiment, described is an example of forming one notch 27 in one of the end surfaces opposing to each other in first linear region 202 and second linear region 203 of the circuit board, but the present invention is not limited to this configuration. For example, one notch 27 is allowable to be formed in the other end surface. However, it is preferable to form a notch in the end surface of the circuit board closer to the region where a semiconductor chip larger in size is mounted from the viewpoint of enhancing the rigidity reducing effect.

Sixth Preferred Embodiment

Figure 8:
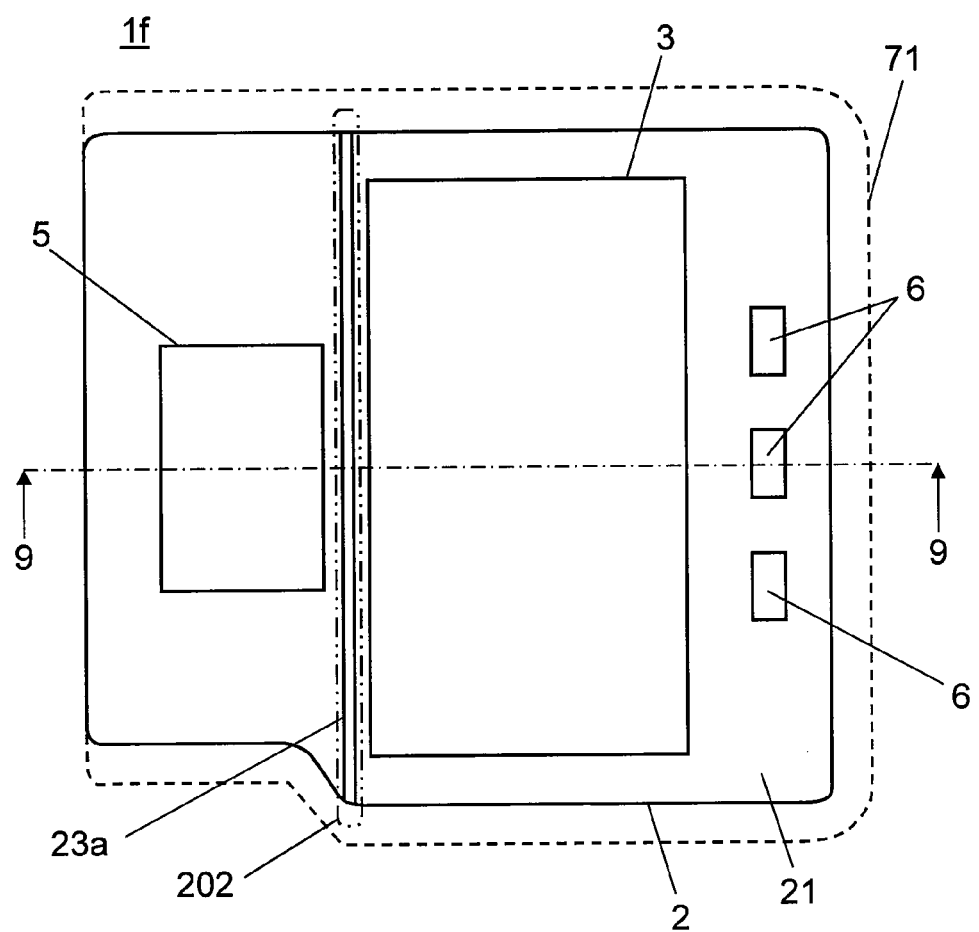
FIG. 8 is a plan view showing the configuration of a memory card in a sixth preferred embodiment of the present invention.

Memory card 1f in the sixth preferred embodiment of the present invention will be described in the following. FIG. 8 is a plan view showing the configuration of memory card 1f in the sixth preferred embodiment of the present invention, and FIG. 9 is a sectional view along the 9-9 line of memory card 1f of FIG. 8.

In this preferred embodiment, as memory card 1f, an example of mini-SD memory card (mini secure digital memory card) will be described. Generally, the length and width (horizontal and vertical sizes in FIG. 8) and thickness (vertical size in FIG. 9) of memory card 1f are respectively 21.5 mm, 20 mm and 1.4 mm.

Figure 9:
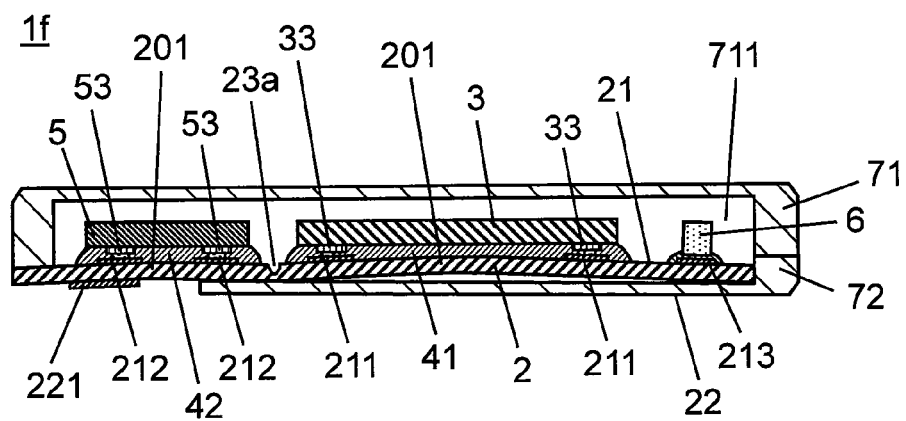
FIG. 9 is a sectional view along the 9-9 line of the memory card shown in FIG. 8.

As shown in FIG. 8 and FIG. 9, same as memory card 1 shown in FIG. 1 to FIG. 3, memory card 1f includes circuit board 2 having a nearly rectangular shape, first semiconductor chip 3 mounted on upper surface 21 of circuit board 2 with bump 33 disposed therebetween, second semiconductor chip 5 mounted on upper surface 21 of circuit board 2 with bump 53 disposed therebetween, sealing resin layer 41, 42 located between first semiconductor chip 3, second semiconductor chip 5, and circuit board 5, fine chip components 6 such as resistors and capacitors mounted by using solder on upper surface 21 of circuit board 2, cover portion 71 for covering first semiconductor chip 3, second semiconductor chip 5, sealing resin layers 41, 42, and chip components 6 on upper surface 21 of circuit board 2, and cover portion 72 for covering a part of lower surface 22 of circuit board 2.

In this case, cover portions 71, 72 are parts molded by using resin material such as epoxy resin for example. As shown in FIG. 9, cover portion 71 includes concave 711 for accommodating first semiconductor chip 3, second semiconductor chip 5, sealing resin layers 41, 42, and chip component 6 which are mounted on circuit board 2. And, cover portion 71 is fitted to circuit board 2 with the opening of concave 711 of cover portion 71 opposed to upper surface 21 of circuit board 2.

Circuit board 2 is formed mainly from glass epoxy resin the same as in the first preferred embodiment and, as shown in FIG. 9, includes electrodes 211, 212, 213 on upper surface 21 to which first semiconductor chip 3, second semiconductor chip 5, and chip component 6 are respectively connected. And, circuit board 2 includes a plurality of external electrode 221 on lower surface 22 for the purpose of making connection to external electronic equipment.

Also, in the present preferred embodiment, as shown in FIG. 8 and FIG. 9, upper surface 21 of circuit board 2 is formed with linear first groove 23a extending in the direction of width between first semiconductor chip 3 and second semiconductor chip 5 adjacently disposed, and the first groove serves as the first rigidity reducing portion of first linear region 202. In this case, the sectional shape of first groove 23a is, as shown in FIG. 9, nearly semi-elliptic shape of 50 μm in width and depth for example, but the width and depth of first groove 23a are exaggerated in the illustration. The sectional shape of first groove 23a is preferable to be semi-circular, triangular, or rectangular, and for example, it is formed by etching, laser beam machining, or cutting process.

And, first semiconductor chip 3 and second semiconductor chip 5 are bare chips, same as in the first preferred embodiment, which are formed mainly from a silicon material, and generally smaller in thermal expansion coefficient than circuit board 2 made of glass epoxy resin. Further, for example, first semiconductor chip 3 is a memory chip for storing various information, and second semiconductor chip 5 is a control chip for controlling first semiconductor chip 3.

In this case, in memory card 1f, first semiconductor chip 3 and second semiconductor chip 5 are bonded to circuit board 2 by thermal compression, and therefore, circuit board 2 flexes in a convex shape toward upper surface 21 as the temperature lowers after bonding. However, since memory card 1f is lowered in rigidity of circuit board 2 at the position of first groove 23a that is the first rigidity reducing portion, as shown in FIG. 9, the regions at either side of first groove 23a of circuit board 2 individually flex in a convex shape toward upper surface 21, thereby forming a plurality of convex regions 201. And, due to the plurality of convex regions 201, the flexure of entire circuit board 2 can be suppressed the same as in the first preferred embodiment.

In the case of memory card 1f in the present preferred embodiment, since cover portions 71, 72 are molded parts, a sufficient effect of suppressing the flexure of circuit board 2 cannot be obtained by forming cover portion 71 on circuit board 2 by means of an insert-molding method as in memory card 1 of the first preferred embodiment. Accordingly, the configuration of memory card 1f capable of suppressing the flexure of entire circuit board 2 is suited for a memory card equipped with circuit board 2 in a limited space formed by cover portions 71, 72 that are molded parts.

Also, in the present preferred embodiment, an example of disposing a groove between adjacent semiconductor chips has been described, but the present invention is not limited to this configuration. For example, it is allowable to form another groove as a second rigidity reducing portion extending in the lengthwise direction vertical to first groove 23a in a region where first semiconductor chip 3 and second semiconductor chip 5 are mounted on upper surface 21 of circuit board 2. That is, it is allowable to dispose a second linear region at least opposing to first semiconductor chip 3 and second semiconductor chip 5, thereby forming a second groove as the second rigidity reducing portion in the second linear region. In this way, it is possible to increase the number of convex regions and to further suppress the flexure of entire circuit board 2.

Also, in the present preferred embodiment, only an example of disposing first groove 23a has been described, but the present invention is not limited to this configuration. For example, it is allowable to harden the resin filled into first groove 23a after mounting of first semiconductor chip 3 and second semiconductor chip 5 and lowering of the temperature of circuit board 2 to the normal temperature. In this way, it is possible to make up for lowering of the rigidity of circuit board 2 due to first groove 23a, enhancing the rigidity of circuit board 2, and to realize a memory card being strong against deformation or the like caused due to external load.

Seventh Preferred Embodiment

Figure 10:
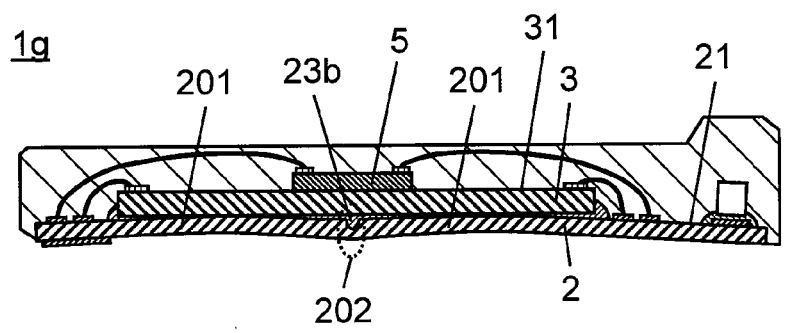
FIG. 10 is a sectional view showing the configuration of a memory card in a seventh preferred embodiment of the present invention.

Memory card 1g in the seventh preferred embodiment of the present invention will be described in the following with reference to FIG. 10. FIG. 10 is a sectional view showing the configuration of memory card 1g in the seventh preferred embodiment of the present invention.

Memory card 1g shown in FIG. 10 is different from the first preferred embodiment in such point that first semiconductor chip 3 is bonded to upper surface 21 of circuit board 2 by using adhesive agent or double-sided adhesive tape, while second semiconductor chip 5 is bonded to upper surface 31 (the surface opposite to circuit board 2) of first semiconductor chip 3 by using an adhesive agent or double-sided adhesive tape. The other components are same in configuration as FIG. 1 to FIG. 3 and given same reference numerals for the purpose of description.

That is, as shown in FIG. 10, in memory card 1g, first semiconductor chip 3 and second semiconductor chip 5 are not provided with bumps. Accordingly, the electrode of each semiconductor chip is electrically connected to the electrode on circuit board 2 for example by a wire-bonding method using a gold wire.

In memory card 1g having the above configuration, when laminated first semiconductor chip 3 and second semiconductor chip 5 are bonded onto circuit board 2, the semiconductor chip pressing operation accompanied by heating of same portion on circuit board 2 is to be performed two times. As a result, the flexure of circuit board 2 becomes greater due to a plurality of heat histories as compared with the case of laminating individual semiconductor chips on circuit board 2. However, the overall flexure of the circuit board can be suppressed because circuit board 2 is provided with a first rigidity reducing portion, and therefore, it is suited even for a memory card with a plurality of semiconductor chips laminated thereon and subjected to the generation of great flexure.

In the case of memory card 1g in the present preferred embodiment, same as in the first preferred embodiment, first groove 23b is formed in first linear region 202 overlapping first semiconductor chip 3, and thereby, the flexure of entire circuit board 2 can be suppressed by forming a plurality of convex regions 201 on circuit board 2.

In the present preferred embodiment, an example of disposing a first groove as the first rigidity reducing portion on the upper surface of the circuit board has been described, but the present invention is not limited to this configuration. For example, on upper surface 21 of circuit board 2, it is also allowable to form one groove extending in the lengthwise direction vertical to first groove 23b as the second rigidity reducing portion in the region where first semiconductor chip 3 is mounted. That is, it is allowable to dispose a second linear region at least opposing to first semiconductor chip 3 and second semiconductor chip 5, thereby forming a second groove as the second rigidity reducing portion in the second linear region. In this way, it is possible to increase the number of convex regions and to further suppress the flexure of entire circuit board 2.

The preferred embodiments of the present invention have been described above, but the present invention is not limited to the preferred embodiments, and it is possible to make various modifications.

For example, in memory card 1 of the first preferred embodiment, it is allowable to form either or both of first groove 23 and second groove 24 on lower surface 22. Also, it is not always necessary to form first groove 23 and second groove 24 over the full length of circuit board 2 ranging from one end to the other end opposing thereto. Further, it is allowable to form first groove 23 and second groove 24 in an oblique shape to the lengthwise direction and widthwise direction of circuit board 2.

Also, in memory card 1 of the first preferred embodiment, from the viewpoint of suppressing the overall flexure of circuit board 2, it is preferable to form both of first groove 23 and second groove 24, but the present invention is not limited to this configuration. For example, forming only one of first groove 23 and second groove 24 is enough to suppress the flexure (for example, when it is possible to make the overall thickness of memory card 1 within the specification), it is allowable to form only one of first groove 23 and second groove 24 on upper surface 21 or lower surface 22 of circuit board 2. Contrarily, when it is necessary to further suppress the flexure of circuit board 2, in addition to first groove 23 and second groove 24, it is allowable to form a plurality of grooves in circuit board 2 radially extending from the intersection between first groove 23 and second groove 24.

Also, in the memory cards of the sixth preferred embodiment and the seventh preferred embodiment, in place of the first groove, it is allowable to form a penetrating-hole, a plurality of penetrating-holes, notch, or paired notches opposing to each other in first linear region 202. Further, in the memory cards of the preferred embodiments, it is allowable to form a plural-element combination in a linear region out of a groove, penetrating-hole, a plurality of penetrating-holes, notch, and paired notches opposing to each other.

Also, in the memory cards of the first preferred embodiment to the fifth preferred embodiment, and the seventh preferred embodiment, it is allowable to provide a linear region on the circuit board that is not opposed to first semiconductor chip 3. However, from the viewpoint of suppressing the overall flexure of circuit board 2, it is preferable to provide a linear region on the circuit board that is opposed to first semiconductor chip 3.

In each of the preferred embodiments, an example of mounting first semiconductor chip 3 and second semiconductor chip 5 by wire bonding or pressure bonding via sealing resin has been described, but the present invention is not limited to this. For example, it is allowable to employ a flip-chip mounting method using anisotropic conductive resin film, anisotropic conductive resin paste, or non-conductive resin paste, and also to employ a flip-flop mounting method using solder.

Also, in each of the preferred embodiments, an example such that first semiconductor chip 3 and second semiconductor chip 5 are a memory chip and a control chip has been described, but the present invention is not limited to this. For example, it is allowable to use other bare chips such as ASIC as first semiconductor chip 3 and second semiconductor chip 5. Further, it is allowable to be configured in that two memory chips as first semiconductor chip 3 and second semiconductor chip 5 are laminated and the two memory chips are controlled by a control chip mounted in other region of circuit board 2. Also, in the first preferred embodiment to the fifth preferred embodiment, as second semiconductor chip 5, it is allowable to mount a memory/controller chip for storing information and controlling other memory chip on circuit board 2. In this case, the semiconductor chip is not always required to be a chip entirely having a semi-conductor function provided that the chip partially uses a semi-conductor function.

Also, in the first preferred embodiment to the fifth preferred embodiment, and the seventh preferred embodiment, it is allowable to use a molded part for cover portion 71 and mount it on circuit board 2.

Further, in the sixth preferred embodiment, it is allowable to form cover portions 71, 72 by insert-molding, for example, using thermoplastic resin and thermosetting resin.

Also, similar effects can be obtained by applying each of the preferred embodiments to a card type recording medium other than SD card.

INDUSTRIAL APPLICABILITY

The present invention is useful in the field of technology such as memory cards used for recording information and especially required to be reduced in thickness.

The invention claimed is:

1. A memory card comprising:
a semiconductor chip;
a circuit board having a main surface on which the semiconductor chip and an electrode are mounted, the circuit board having at least one first groove formed inwardly from the main surface into a body of the circuit board and at least one second groove formed inwardly from a surface opposite to the main surface into a body of the circuit board; and
a cover portion for covering the semiconductor chip at a main surface side of the circuit board, wherein:
the number of said at least one first groove is greater than the number of said at least one second groove, and
said at least one first groove and said at least one second groove are provided on the circuit board itself, and do not penetrate through the circuit board, and
the circuit board is in a form of a plate having a constant thickness except for the first and second grooves.

2. The memory card of claim 1, wherein said at least one first groove is at least opposed to the semiconductor chip.

3. The memory card of claim 1, wherein said at least one first groove is perpendicular to said at least one second groove in the circuit board.

4. The memory card of claim 1, further comprising another semiconductor chip mounted on the circuit board adjacent to the semiconductor chip,
wherein at least said at least one first groove is positioned between the semiconductor chip and the another semiconductor chip.

5. The memory card of claim 1, wherein the cover portion is made of thermoplastic resin formed to cover the semiconductor chip on the circuit board.

6. The memory card of claim 1, wherein the cover portion has a concave portion for accommodating the semiconductor chip, which is a molded part mounted on the circuit board with the concave opening toward the circuit board.

7. The memory card of claim 1, wherein at least a part of said at least one first groove is disposed below the semiconductor chip.

8. The memory card of claim 1, wherein the body of the circuit board is made of resin.

* * * * *